(12) United States Patent
Tournier et al.

(10) Patent No.: US 6,262,750 B1
(45) Date of Patent: Jul. 17, 2001

(54) PROCESS FOR STORING CUES WITH DIFFERENT FORMATS IN A MEMORY AND CORRESPONDING STORAGE AND READING DEVICE

(75) Inventors: Christian Tournier, Seyssinet-Pariset; Laurent Lusinchi, Saint Egreve, both of (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/198,435

(22) Filed: Nov. 24, 1998

(30) Foreign Application Priority Data

Nov. 24, 1997 (FR) .................................................. 97 14727

(51) Int. Cl.⁷ ...................................................... G06F 12/00
(52) U.S. Cl. ........................... 345/564; 348/714; 348/718
(58) Field of Search ................................... 345/564, 530, 345/531, 572; 348/714–718

(56) References Cited

U.S. PATENT DOCUMENTS 4,496,997 * 1/1985 Ohtsuki .................................. 360/13

5,539,428  7/1996 Bril et al. .............................. 345/143

FOREIGN PATENT DOCUMENTS 0111946  6/1984 (EP) ................................. G09G/1/16

OTHER PUBLICATIONS

French Search Report (Sep. 21, 1998).

* cited by examiner

*Primary Examiner*—Kee M. Tung
(74) *Attorney, Agent, or Firm*—Theodore E. Galanthay; Stephen Bongini; Fleit, Kahn, Gibbons, Gutman & Bongini P.L.

(57) ABSTRACT

The memory (MM) is addressed, depending on the format, with address words (MDC) formed at least from the high-order bits of the identifier (ID) of each cue, and possibly padded out with check or selection words (MS) making it possible either to designate consecutive addresses or to select some of the latter from each memory cell (CM) depending on the low-order bits of the identifier. This allows continuous addressing of the memory irrespective of the format used, thereby optimizing the memory size and avoiding a structural or software modification of the addressing system with each change of format.

4 Claims, 4 Drawing Sheets

PROCESS FOR STORING CUES WITH DIFFERENT FORMATS IN A MEMORY AND CORRESPONDING STORAGE AND READING DEVICE

CROSS-REFERENCE TO RELATED APPLICATIONS

This application is based on and claims the benefit of priority of the prior French Patent Application No. 9714727 filed on Nov. 24, 1997, the contents of which are hereby incorporated by reference.

BACKGROUND OF THE INVENTION

1. Field of the Invention

The invention relates to the storage of cues with different formats in a memory and to their reading therefrom.

The invention applies advantageously but not in a limiting fashion to the field of television, and more particularly to the storing of characters with different formats in and to their reading from a read-only memory intended to be read by the screen controller for the displaying thereon of the characters thus read.

2. Discussion of the Related Art

In graphics systems each character is generally represented over a certain number of bits, for example 9×13 corresponding to a matrix of 9×13 pixels. The format in which the characters are represented may be standardized, for example in the case of subtitling, or else can be free, especially as regards characters specifically dedicated to the television monitor.

An example is the so-called "menu" characters which allow symbols, such as a crossed-out loudspeaker, to appear on the screen to indicate that the sound from the television has been switched off. Moreover, whereas the characters with a 9×13 format are used, for example in the United States, certain countries which use a non-Latin alphabet require different character formats, for example an 18×26 format. Generally, one character format is required for a given application, for example a 9×13 format or an 18×26 format. At present, the design and construction of a system for storing and reading characters in a given format are specific to the format and such a system needs to be completely re-investigated, especially as regards the addressing of the memory for storing the characters, for a different character format. A solution for this problem is needed. An object of the invention is a device for storing and reading cues with different formats whose hardware and software architecture, especially as regards the addressing of the memory, is identical for these different formats of cues (e.g., a 9×13 format and an 18×26 format).

An object of the invention is also to achieve such a device in which the size of the storage memory is optimized and can be reduced or increased as a function of the number of characters to be stored whatever format is used, and without this requiring significant modifications to the structure of the addressing means.

Another object of the invention is to be able to store in the storage memory solely characters with a first format (for example 9×13) or else solely characters with a second format (for example 18×26) or alternatively characters with a first format and characters with a second format, and to do so while preserving the same addressing structure.

SUMMARY OF THE INVENTION

Briefly, in accordance with an aspect of the invention, in a process for storing cues with different formats in a memory, these cues, for example alphanumeric characters, comprise first cues with a first format (for example 9×13), each cue represented over a first number of bits (9×13) and each is identified by a first identifier coded over p+n+e bits (for example 11 bits), p (for example 8) and n (for example 2) being strictly positive integers and e (for example 1) being a positive or zero integer. The e bits (if any) are advantageously addressing expansion bits for flexibly increasing the number of characters which can be stored. The cues can also comprise second cues with a second format, each cue represented over a second number of bits greater than or equal to the product of the first number times $2^n$ and each identified by a second identifier coded over p+e bits. In the case of a second format which is equal, for example, to 18×26, the second number of bits will be equal to the product of the first number (9×13) times $2^2$.

The memory comprises memory cells which can, depending on the structure of the memory, each contain $2^k$ sets of bits, the number of bits of each set of bits being at least equal to the said first number (in this instance 9×13). Here, k is an integer greater than or equal to 0 and less than or equal to n and each memory cell can be designated by a cell address word of p+n−k+e bits.

Thus, according to a first characteristic of the invention, each second cue is split up, with a view to its storage, into $2^n$ sets of bits shared out among one or more memory cells depending on the structure of the memory, that is to say depending on the value of k. If the second format under consideration is such that the second number of bits (for example 18×26) each representing a second cue is exactly equal to the product of the first number P1 of bits (9×13) times $2^n$ (in this instance $2^2$), then the number of bits of each set of bits which is contained in a memory cell is equal to the first number of bits (9×13). On the other hand, if the second format under consideration (for example 22×30) is such that the second number of bits lies between $2^n.P1$ and $2^{n+1}.P1$ (in this instance $2^2.(9\times13) < 22\times30 < 2^3(9\times13)$), then the number of bits of each set of bits which is contained in a memory cell is greater than the first number of bits so as to allow the correct and complete representation of each second cue.

Furthermore, according to a process according to the invention, if k is zero, that is to say each memory cell (or memory word) contains just a single set of bits, each first cue is stored in the memory cell designated by a cell address word whose bits correspond to the p+n+e bits of the identifier of the first cue.

It should be noted here that within the meaning of the first invention, the verb "correspond" should be interpreted very broadly. More precisely, it is particularly advantageous in practice for the bits of the cell address word to be equal to the bits of the identifier of the first cue. This being so, provision could also be made for a predetermined table of correspondence between the value of the bits of the cell address word and the value of the bits of the identifier.

If k is non-zero, that is to say if each memory word or memory cell comprises several sets of bits, each first cue is then stored in a part of the memory cell designated by a cell address word whose bits correspond to the p+n+e−k high-order bits of the identifier of the first cue, this part of the memory cell thus designated being selected from among the $2^k$ sets of bits contained in this designated memory cell, which selection is made with the aid of a selection word of k bits corresponding to the k low-order bits of the identifier of this first cue.

Furthermore, as regards the storage of a second cue (18×26 format, for example), if k is equal to n, this signifying that each memory cell or memory word contains $2^n$ sets of bits, the $2^n$ sets of bits forming each second cue are then stored in the memory cell designated by a cell address word whose e+p bits correspond to the e+p bits of the identifier of this second cue.

If k is different from n, this signifying that each second cue is then shared out among several memory cells, the two $2^n$ sets of bits forming each second cue are stored in the $2^{n-k}$ memory cells with consecutive addresses designated by $2^{n-k}$ cell address words whose e+p high-order bits correspond to the e+p bits of the identifier of this second cue.

The storage process according to the invention therefore makes it possible to store the cues, whatever their format, in an optimized manner in the memory, that is to say without leaving "gaps" in the memory space used, that is to say without leaving a totally unoccupied memory cell between two occupied memory cells. Thus, stated otherwise, the invention allows storage of cues in memory cells whose addresses follow one another continuously, whatever the format of the cue stored. And this absence of discontinuity in the addresses of the memory cells used persists even if the number of cues to be stored has to be reduced or increased, by diminishing or increasing the number e of address extension bits, this making it possible, whatever the number of cues to be stored, to optimize the size of the memory and to obtain a memory in which any unused memory space is in all cases a minimum.

The invention also proposes a device for storing and reading cues with different formats, in which the said cues can comprise first cues with a first format, each cue represented over a first number of bits and each identified by a first identifier coded on p+n+e bits, p and n being strictly positive integers and e being a positive or zero integer, and/or second cues with a second format, each cue represented over a second number of bits which is greater than or equal to the product of the first number times $2^n$ and each identified by a second identifier coded on p+e bits.

A device according to an aspect of the invention comprises:
   a memory comprising memory cells (or memory words), each able to contain $2^k$ sets of bits, and to be designated by a cell address word of p+n−k+e bits, k being an integer greater than or equal to zero and less than or equal to n, the number of bits of each set of bits being at least equal to the said first number,
   addressing means possessing a first state in which for each first cue they are able to derive, if k is zero, a cell address word whose bits correspond to the p+n+e bits of the identifier of the first cue and, if k is non-zero, a cell address word whose bits correspond to the p+n+e−k high-order bits of the identifier of the first cue. If k is non-zero, the addressing means are also able to derive for each first cue a selection word of k bits corresponding to the k low-order bits of the identifier of this first cue. The addressing means moreover possess a second state in which for each second cue they are able to derive, if k is equal to n, a cell address word whose e+p bits correspond to the e+p bits of the identifier of this second cue, and, if k is different from n, $2^{n-k}$ cell address words whose e+p high-order bits correspond to the e+p bits of the identifier of this second cue.

The device according to the invention furthermore possibly comprises reading means possessing a first state in which, for each cell address word derived, they extract from the memory the set of bits stored in the memory cell designated by the said cell address word, this set of bits being optionally selected if k is non-zero, depending on the values of the k bits of the selection word, from the $2^k$ sets of bits of the said designated memory cell. The reading means furthermore possess a second state in which for each cell address word derived they extract, if k is equal to n, the $2^n$ sets of bits stored in the memory cell designated by the cell address word, and if k is different from n, the $2^n$ sets of bits stored in the $2^{n-k}$ memory cells with consecutive addresses designed by $2^{n-k}$ cell address words.

Lastly, the device according to the invention may comprise control means placing the addressing and reading means in their first or in their second state depending on the format of the cue.

Thus, according to the invention, the memory is addressed with address words of the same size whatever the format of the cue to be extracted. Only the contents of the addressing word, that is to say the value of the bits of the addressing word, differ depending on the format and depending on the cue to be extracted. However, this does not require any modification to the hardware structure of the addressing system nor to the software structure of this addressing system.

Whereas in certain applications the memory cells could be simple memory words, in a television application using characters represented in matrix form, each first cue is in fact represented by a matrix of j rows each of i bits. Thus, each memory cell comprises a block of j packets each of i bits, and in that the addressing means derive for each cue j row addressing words from the corresponding cell addressing word and from a header word making it possible to designate selectively each of the j packets. The reading means then successively read the j packets of each designated memory cell.

BRIEF DESCRIPTION OF THE DRAWINGS

Other advantages and characteristics of the invention will emerge on examining the detailed description of wholly non-limiting embodiments and modes of implementation, and the appended drawings in which.

DESCRIPTION OF AN EMBODIMENT

It is now assumed, although the invention is not limited thereto, that the storage memory is a read-only memory read by a screen controller of a television set and capable of storing characters CA with a first format (9×13) and/or characters CB with a second format (18×26). Stated otherwise, in the example now described, n is equal to 2.

Figure 1:
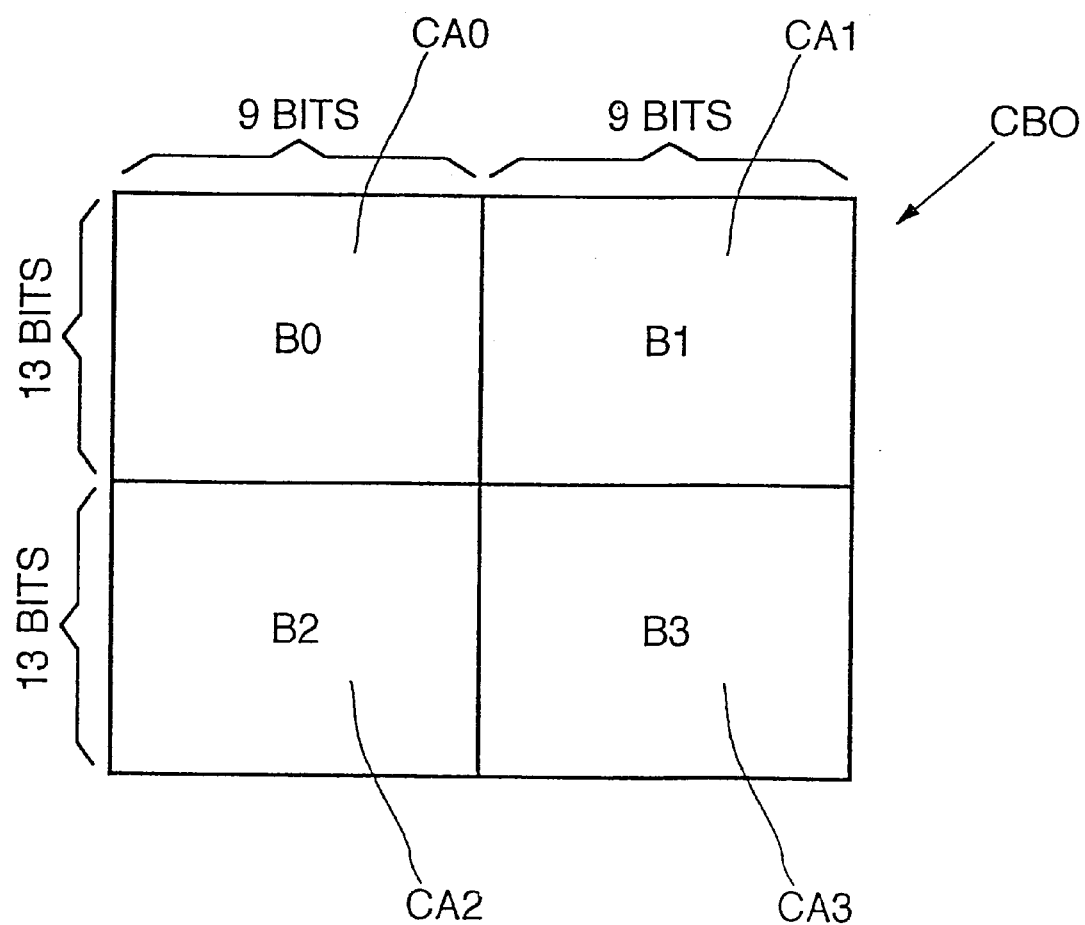
FIG. 1 schematically illustrates the representation of a character with a first format and a character with a second format.

In FIG. 1, the references B0–B3 respectively designate four sets of 9×13 bits which make it possible to represent four first characters CA0–CA3 respectively.

In the example described here, a character CB0 with the second format is represented over a second number of bits (18×26) which can be split into $2^2$ sets of 9×13 bits.

More precisely, here, the sets B0 and B1 describe rows 1 to 13 of the character CB0 whilst the sets of bits B2 and B3 describe rows 14 to 26 of this character CB0. Moreover, the sets of bits BO and B2 describe the left half of the character CB0 and the sets of bits B1 and B3 describe the right part of the character CB0.

Figure 2:
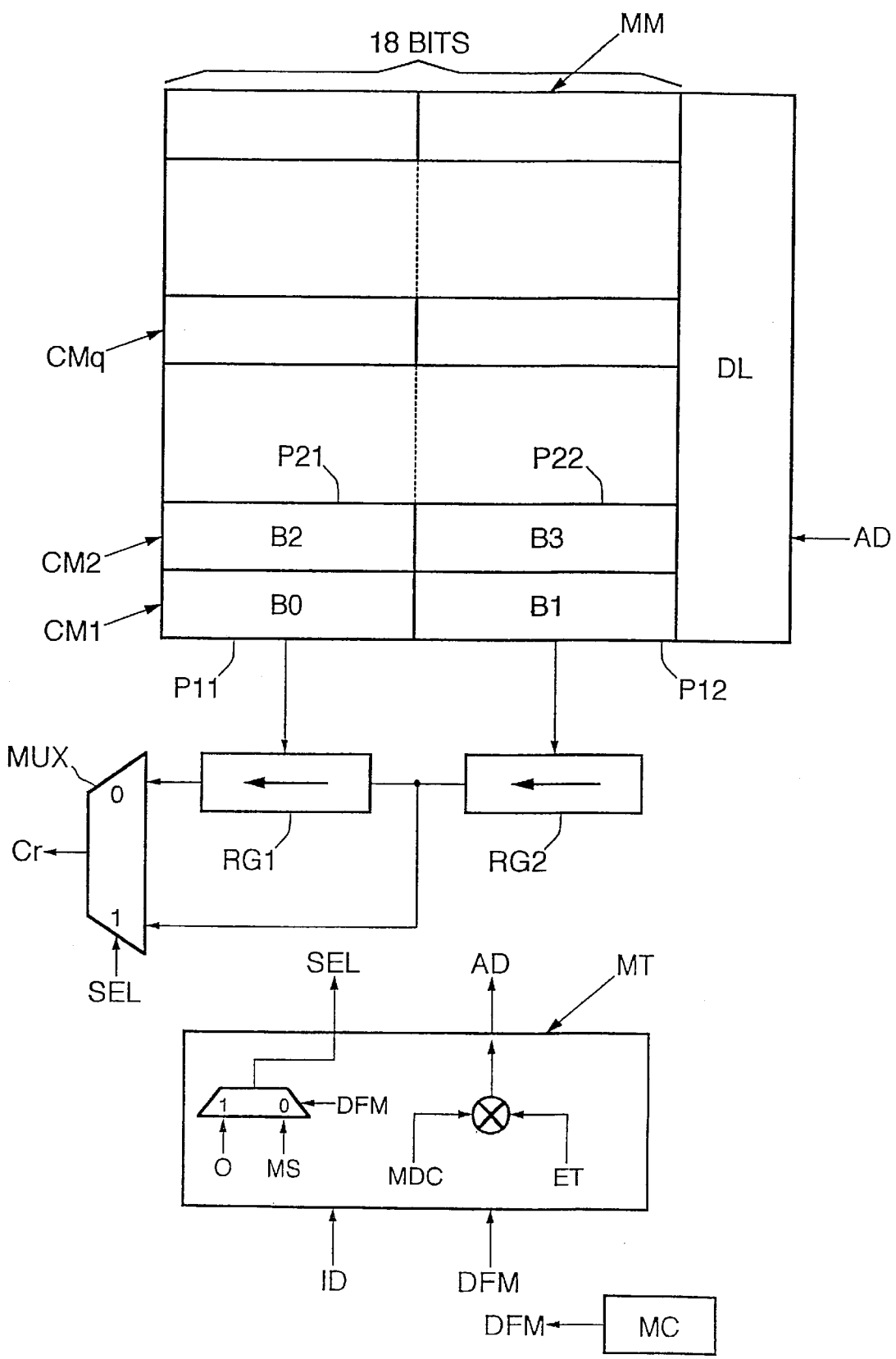
FIG. 2 is a very schematic overview of an embodiment of a device according to the invention, FIGS. 3 and 4 respectively illustrate two identifiers of characters with different formats, FIG. 5 schematically illustrates the structure of a cell address word.

In FIG. 2, the reference MM designates the read-only memory for storing the set of characters intended to be displayed on the screen. This memory MM can be split into a plurality of memory cells CMq. It is moreover assumed here that the width of each memory cell CMq is two sets of 9×13 bits, that is to say that it is subdivided into two parts each containing a set of 9×13 bits. Stated otherwise, in the example described here, k is equal to 1.

Addressing means incorporated into processing means MT are able, as will be seen in greater detail below, to derive a row address word AD from a cell address word MDC designating each cell of the memory MM and from a header word ET making it possible to designate, for each cell, one of the thirteen packets of 9 bits which it contains. Each address word MDC is derived from the identifier ID of a character and a format bit DFM delivered by control means MC (DFM=0 for 9×13 and DFM=1 for 18×26).

The device according to the invention furthermore comprises a conventional row decoder DL making it possible, on the basis of the row address word AD, to address the corresponding row of a cell, as well as two shift registers RG1 and RG2 respectively connected to the output port of the memory MM and intended to receive the bits of each of the two parts (for example P11, P12 or P21, P22) of each memory cell. These two shift registers are connected in series. Moreover, the output of each of these shift registers is linked to the two inputs of a multiplexer MUX controlled by a control signal SEL emanating from the processing means. The output of the multiplexer MUX delivers the set of bits Bi embodying either a character Cr with a first format or a part of a character with a second format. More precisely, as will be seen below, depending on the value of the bit DFM, the signal SEL will take the value 0 or will be equal to a selection word MS made up here of the low-order bit (k=1) of the identifier of the character with the first format.

The row decoder DL, the two registers RG1 and RG2, the multiplexer MUX, and also the means which make it possible to derive the signal SEL and are incorporated within the processing means MT, functionally form means for reading the memory MM.

Apart from the row decoder MM, the two shift registers and the multiplexer MUX, the other means of the device can be embodied in software fashion within a microprocessor, or else be embodied in hardware fashion within a specific circuit (ASIC).

Reference is now made more particularly to FIGS. 3 to 7 in order to illustrate a mode of operation of the device according to the invention.

It is now assumed that each character CA with the first format is identified by an identifier IDA (FIG. 3) coded over eleven bits. More precisely, the identifier IDA is made up of a word CHC of p bits (p=8 here) preceded by n bits SPL1, SPL2 (n=2 here) themselves preceded by a bit XCOD (e=1). Generally, the characters intended for subtitling, for example, are standardized and are identified with the aid of an identification word of p bits (typically 8 bits). Thus, the identifiers IDA of these standardized characters will in fact have their bits SPL1, SPL2 and XCOD equal to zero. This being so, the appending of these three additional bits may make it possible to store in the memory MM other characters with the first format, for example so-called "menu" characters, making it possible to display symbols on the screen, such as, for example, a crossed-out loudspeaker.

The identifier IDB of each character with a second format is made up of a word CHC of p bits which is preceded by the bit XCOD. Thus, it is possible to identify $2^p$ standardized characters with the 18×26 format, which characters can be used, for example, for subtitling in Chinese characters. The bit XCOD, which is an addressing extension bit, makes it possible optionally to store in the matrix MM twice as many characters with the 18×26 format, that is to say to store, in addition to the standardized characters, other menu characters.

Figure 5:
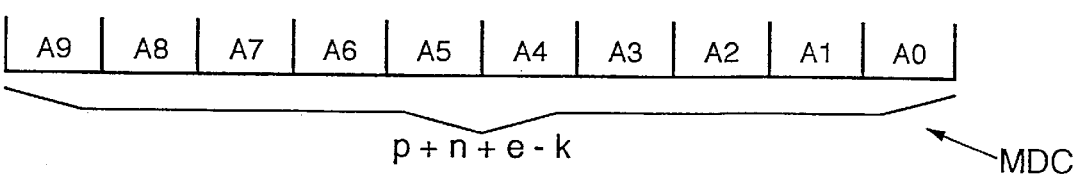
Figure 6:
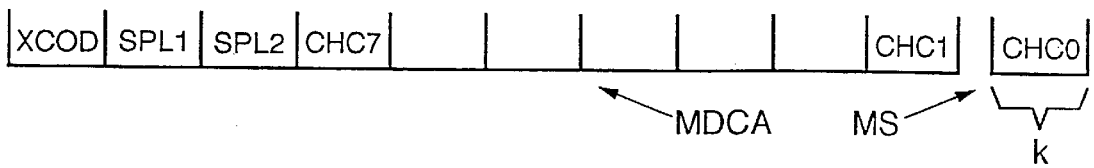
FIG. 6 illustrates a cell address word and a selection word which is used for addressing a memory cell containing a character with a first format.
Figure 7A:
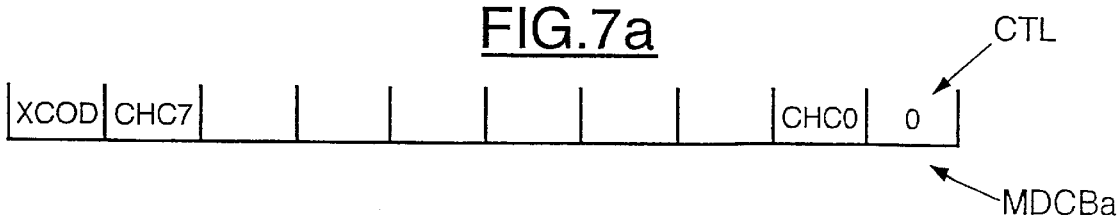
FIGS. 7a and 7b illustrate two cell address words making it possible to address two memory cells containing the various parts of a character with a second format.
Figure 7B:
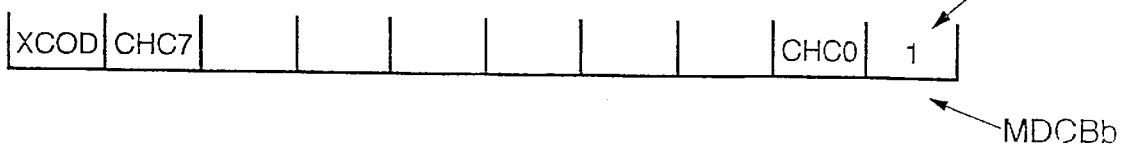
Figure 8:
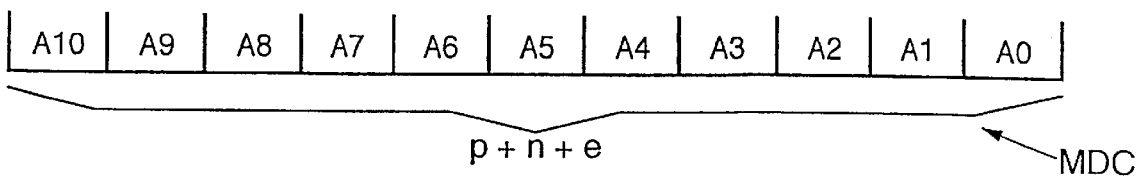
FIG. 8 illustrates another possible structure of a cell address word, FIG. 9 schematically illustrates a cell address word which can be used to extract a character with a first format by using the word structure illustrated in FIG. 8, and FIGS. 10a to 10d schematically illustrate four cell address words which use the structure of FIG. 8, and make it possible to extract a character with a second format.
Figure 9:
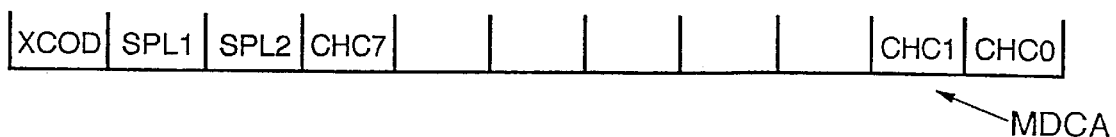
Figure 10A:
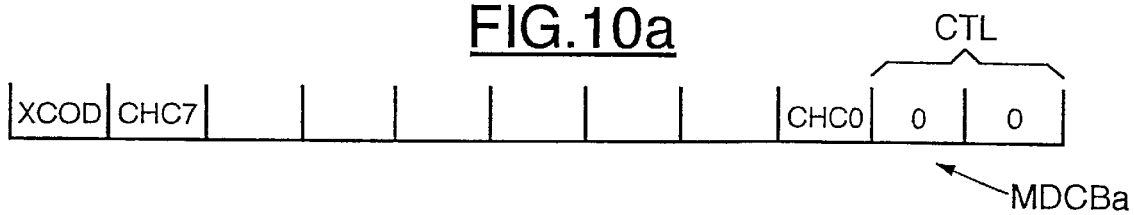
Figure 10B:
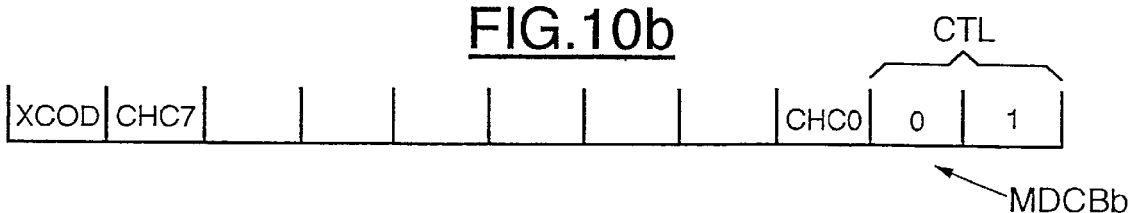
Figure 10C:
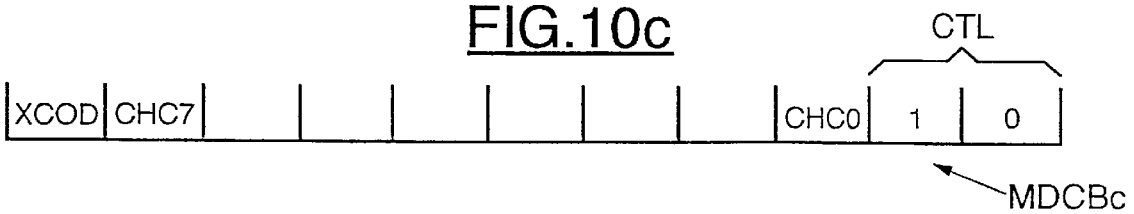
Figure 10D:
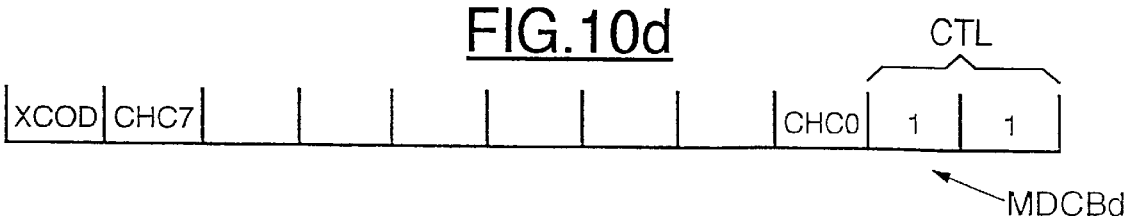

As illustrated in FIG. 5, each memory cell CM is designated by a cell address word MDC of p+n+e−k bits, that is to say in this instance ten bits, A0–A9.

Let us now assume that the memory MM stores only characters with the first format.

Since each memory cell can contain two first-format characters, the memory cell designated by the address word MDCA (FIG. 6) will store the two characters with the first format whose nine high-order bits XCOD, SPL1, SPL2, CH7-CHC1 (that is to say all the bits except the low-order bit CHC0) are identical to the counterpart bits of the model of the cell address word MDCA.

The part (for example P11, P12) of the memory cell in which the character will actually be stored will be selected as a function of the value of the low-order bit CHC0 of the identifier of this character.

Figure 3:
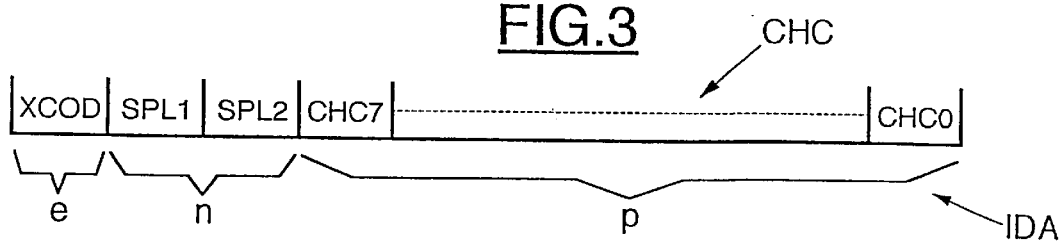

Thus, if reference is now made more particularly to FIG. 2, and with the assumption that the controller of the television screen transmits a signal for reading the character with the first format whose identifier IDA is that illustrated in FIG. 3, the addressing means will derive the address word MDCA corresponding to the nine high-order bits of this identifier so as to designate the corresponding cell, for example the cell CM1. The reading means will then extract the sets of bits B0 and B1 from the cell CM1 and they will be stored in the shift registers RG1 and RG2. The multiplexer MUX is then controlled by the low-order bit CHC0 of the identifier IDA of the character. Stated otherwise, the reading means confer the value of the selection word MS (low-order bit CHC0) on the control signal SEL so as to select, in the present case, the bits stored in the shift register RG1.

Let us now assume that the memory MM comprises only characters with the second format, that is to say characters with the 18×26 format. Since each memory cell comprises only two sets of 9×13 bits, the $2^n$ (here $2^2$) sets of bits forming each 18×26 character will have to be stored in two different memory cells. Additionally, according to the invention, these $2^n$ sets of bits are stored in consecutive locations of the memory, that is to say in this instance in two memory cells with consecutive addresses.

Figure 4:
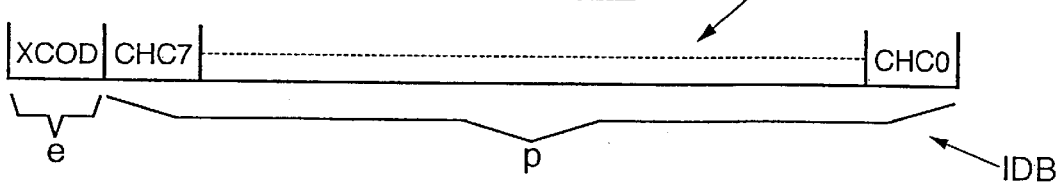

More precisely, the character with the second format, whose identifier IDB is that of FIG. 4, will be shared among the two memory cells designated by the two cell address words (MDCBa and MDCBb (FIG. 7a and FIG. 7b) whose nine high-order bits correspond to the nine bits of the identifier IDB and whose low-order bit CTL is equal to zero and to one respectively. These two memory cells are therefore situated at two consecutive addresses.

If reference is now made more particularly to FIG. 2, the control means MC place the addressing and reading means in their second state (DFM=1). The addressing means then derive the two address words (MDCBa and MDCBb). These two address words are therefore formed by the bits of the identifier IDB of the character CB right-padded with a CTL check word of k bits (k=1 here) making it possible to designate successive addresses. Furthermore, the reading means confer the zero value on the value SEL and extract the bits of the two sets of bits of the two designated cells from the memory MM in succession.

Of course, the memory MM can comprise first-format characters and also second-format characters, which quite obviously will not be stored in the same memory cells.

FIGS. 8 to 10d illustrate a mode of operation of the device in which k is zero. Stated otherwise, each memory cell CMq comprises just a single set of 9×13 bits and is designated by a cell address word MDC of p+n+e bits (in this instance 11 bits) A0–A10.

In this case, each character with the first format will advantageously be stored in the memory cell whose cell address word MDCA (FIG. 9) corresponds to the identifier IDA of this character. Thus, to read a character, the addressing means will then physically point the memory at the cell whose address corresponds to the identifier.

As regards a character with the second format (18×26), the four sets of 9×13 bits forming this character will be stored in four cells with consecutive addresses and respectively designated by the cell address words MDCBa–MDCBd (FIGS. 10a–10d). The nine high-order bits of each of these four cell address words will be equal to the nine bits of the identifier of the second character. The two low-order bits (check word CTL) will be equal to zero and one alternately so as to form four consecutive addresses. To extract such a character, the addressing means will point the memory in succession with the four cell address words thus formed so as to extract in succession the four sets of bits which form this character and make it possible, by combination, to represent it.

Thus, in this embodiment, if the memory contains only characters with the first format (9×13), the characters identified by the identifiers of decimal values 0 1 2 3 4 5 6 7 8 9 10 . . . will be stored respectively in the memory cells with addresses 0 1 2 3 4 5 6 7 8 9 10 . . . (in decimal notation).

If the memory contains only characters with the second format (18×26), the characters identified by the identifiers 0;1;2;3 will be stored respectively in the cells with addresses 0 1 2 3; 4 5 6 7; 8 9 10 11; and 12 13 14 15 (in decimal notation).

Stated otherwise, in this case, the characters with the second format are stored at addresses which are multiples of $2^n$ (here of four $2^2$) of the memory.

If the memory contains first-format and also second-format characters, it is possible, for example, to contrive that the characters with the first format having as identifiers 0, 1, 2, 3, 8, 9, 10 be stored respectively in the memory cell with addresses 0, 1, 2, 3, 8, 9, 10 whereas the character with the second format having the identifier 1, be stored in the memory cells with the addresses 4 5 6 and 7.

The person skilled in the art will therefore observe in particular with regard to this illustrative embodiment that the invention allows optimal memory storage, that is to say without "gaps" and does so whatever the mode of operation used (9×13 mode or 18×26 mode). The absence of discontinuity in the addressing of the memory remains even if the number of characters to be stored increases, that is to say if the number of address extension bits XCOD increases.

Lastly, the invention allows addressing of the memory in 9×13 mode for all the characters, in 18×26 mode for all the characters or in mixed mode, that is to say in which it is possible to change format from one character to another, this being so without modification to the software and hardware structure of the addressing and reading means.

We claim:

1. A process for storing cues with different formats in a memory, the cues comprising first cues with a first format, each cue represented over a first number of bits and each identified by a first identifier coded on p+n+e bits, p and n being strictly positive integers and e being a positive or zero integer, and/or second cues with a second format, each cue represented over a second number of bits which is greater than or equal to the product of the first number times $2^n$ and each identified by a second identifier coded on p+e bits, the said memory comprising memory cells each able to contain $2^k$ sets of bits and to be designated by a cell address word of p+n–k+e bits, k being an integer greater than or equal to zero and less than or equal to n, the number of bits of each set of bits being at least equal to the said first number, in which process, if k is zero, each first cue is stored in the memory cell designated by a cell address word whose bits correspond to the p+n+e bits of the identifier of the first cue, t of the memory cell designated by a cell address word whose bits correspond to the p+n+e–k high-order bits of the identifier of the first cue, which part is selected from the $2^k$ sets of bits contained in this designated memory cell, with the aid of a selection word of k bits corresponding to the k low-order bits of the identifier of this first cue, and which, is k is equal to n, the $2^n$ sets of bits forming each second cue are stored in the memory cell designated by a cell address word whose e+p bits correspond to the e+p bits of the identifier of this second cue and, if k is different from n, the $2^n$ sets of bits forming each second cue are stored in the $2^{n-k}$ memory cells with consecutive addresses designated by $2^{n-k}$ cell address words whose e+p high-order bits correspond to the e+p bits of the identifier of this second cue.

2. A device for storing and reading cues with different formats, in which the said cues can comprise first cues with a first format, each cue represented over a first number of bits and each identified by a first identifier coded on p+n+e bits, p and n being strictly positive integers and e being a positive or zero integer, and/or second cues with a second format, each cue represented over a second number of bits which is greater than or equal to the product of the first number times $2^n$ and each identified by a second identifier coded on p+e bits, comprising a memory comprising memory cells each able to contain $2^k$ sets of bits, and to be designated by a cell address word of p+n–k+e bits, k being an integer greater than or equal to zero and less than or equal to n, the number of bits of each set of bits being at least equal to the said first number, addressing means possessing a first state in which for each first cue they are able to derive, if k is zero, a cell address word whose bits correspond to the p+n+e bits of the identifier of the first cue and, if k is non-zero, a cell address word whose bits correspond to the p+n+e–k high-order bits of the identifier of the first cue, as well as a selection word of k bits corresponding to the k low-order bits of the identifier of this first cue, and a second state in which for each second cue they are able to derive, if k is equal to n, a cell address word whose e+p bits correspond to the e+p bits of the identifier of this second cue and, if k is different from n, $2^{n-k}$ cell address words whose e+p high-order bits correspond to the e+p bits of the identifier of this second cue, reading means possessing a first state in which, for each cell address word derived, they extract from the memory the set of bits stored in the memory cell designated by the said cell address word, and optionally selected if k is non-zero, depending on the values of the k bits of the selection word, from the $2^k$ sets of bits of the said designated memory cell, and a second state in which for each cell address word derived they extract, if k is equal to n, the $2^n$ sets of bits stored in the memory cell designated by the cell address word, and if k is different from n, the $2^n$ sets of bits stored in the $2^{n-k}$ memory cells with consecutive addresses designed by $2^{n-k}$ cell address words, and control means for placing the addressing and reading means in their first or in their second state depending on the format of the cue (DFM=0; DFM=1).

3. The device according to claim 2, wherein each first cue is represented by a matrix of j rows each of i bits, in that each memory cell comprises a block of j packets each of i bits, and the addressing means derive for each cue j row addressing words from the corresponding cell addressing word and from a header word making it possible to designate selectively each of the j packets, and wherein the reading means include means for successively reading the j packets of each designated memory cell.

4. The device according to claim 2, wherein the reading means comprise $2^k$ shift registers respectively linked to the data output of the memory.

* * * * *